(12) United States Patent
Bhalla et al.

(10) Patent No.: US 7,436,022 B2
(45) Date of Patent: Oct. 14, 2008

(54) ENHANCING SCHOTTKY BREAKDOWN VOLTAGE (BV) WITHOUT AFFECTING AN INTEGRATED MOSFET-SCHOTTKY DEVICE LAYOUT

(75) Inventors: Anup Bhalla, Santa Clara, CA (US); Daniel Ng, Campbell, CA (US); Sik K Lui, Sunnyvale, CA (US)

(73) Assignee: Alpha & Omega Semiconductors, Ltd., Hamilton (BM)

( * ) Notice: Subject to any disclaimer, the term of this patent is extended or adjusted under 35 U.S.C. 154(b) by 335 days.

(21) Appl. No.: 11/413,249

(22) Filed: Apr. 29, 2006

(65) Prior Publication Data

US 2006/0202264 A1 Sep. 14, 2006

Related U.S. Application Data

(63) Continuation-in-part of application No. 11/056,346, filed on Feb. 11, 2005, now Pat. No. 7,285,822.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/328; 257/330; 438/212
(58) Field of Classification Search .............. 257/260, 257/328–330, 490, 495, 563, 564; 438/212, 438/268, 560
See application file for complete search history.

(56) References Cited

U.S. PATENT DOCUMENTS 4,134,123 A * 1/1979 Shannon ................... 257/484

* cited by examiner

*Primary Examiner*—Thien F Tran
(74) *Attorney, Agent, or Firm*—Bo-In LIn

(57) ABSTRACT

This invention discloses a semiconductor power device that includes an active cell area having a plurality of power transistor cells and a junction barrier Schottky (JBS) area. The semiconductor power device includes the JBS area that further includes a plurality of Schottky diodes each having a PN junction disposed on an epitaxial layer near a top surface of a semiconductor substrate wherein the PN junction further includes a counter dopant region disposed in the epitaxial layer for reducing a sudden reversal of dopant profile near the PN junction for preventing an early breakdown in the PN junction.

39 Claims, 14 Drawing Sheets

ENHANCING SCHOTTKY BREAKDOWN VOLTAGE (BV) WITHOUT AFFECTING AN INTEGRATED MOSFET-SCHOTTKY DEVICE LAYOUT

This patent application is a Continuation in Part (CIP) Application of a Application with a Ser. No. 11/056,346 filed by a common Inventor of this Application on Feb. 11, 2005 now U.S. Pat No. 7,285,822. The Disclosures made in that Application is hereby incorporated by reference.

BACKGROUND OF THE INVENTION

1. Field of the Invention

The invention relates generally to the semiconductor power devices. More particularly, this invention relates to an improved and novel manufacturing process and device configuration for providing the MOSFET device with Schottky source contact having a higher breakdown voltage for improving performance of high frequency power switching, H-bridge and synchronization rectification applications without affecting layout of the integrated MOSFET-Schottky device.

2. Description of the Related Art

In order to reduce the power consumptions and to increase the switching speed of a power semiconductor power device, it is desirable to further reduce the on-resistance and the gate capacitance. Integration of an Schottky diode in a semiconductor power device such as a metal oxide silicon field effect transistor (MOSFET) has been implemented. FIGS. 1A and 1B show the standard MOSFET devices that integrate the Schottky diodes to bypass the body diode thus improving the behavior of a MOSFET device. Improvements in the MOSFET device performances enhance the H-bridge and synchronization rectification applications. Specifically, FIG. 1A shows a MOSFET with an integrated Junction Barrier controlled Schottky (JBS) area. The integrated JBS may be a Schottky diode array with a P-N junction grid interspersed between the Schottky contacts. The P-N junction will pinch-off the channel regions under the Schottky contacts to inhibit the formation of large reverse leakage current once a threshold reverse-biased voltage is applied. The shielding effect caused by the depletion layer also improves the breakdown voltage. However, there is a tradeoff that due to an increase of the series resistance. Also, since the presence of P-N junction in the integrated JBS regions takes up a large portion of surface area, for practical considerations, it may be required to reduce the overall Schottky contact areas dedicated to the forward conduction. Under that circumstance, there is an increase of the on-state forward voltage drop cause by this reduction of the overall Schottky contact area. In FIG. 1B, the integrated trench MOS barrier Schottky (TMBS) is implemented. The integrated TMBS includes Schottky diode array interspersed with MOS trench. The charge coupling between the majority charge carrier in the mesa-shaped portion of the epitaxial/drift region and the metal on the insulated sidewalls of the trenches causes a redistribution of the electric filed profile under the Schottky contact which improves the breakdown and reduces reverse leakage current.

U.S. Pat. No. 4,675,713 discloses a method of using the source Schottky junction as the body contact for a semiconductor power device. U.S. Pat. No. 4,983,535 discloses a fabrication method to manufacture a DMOS device with a source implemented with a refractory metal Schottky barrier located on top of the body region. However, these devices still have the limitations of using metals of relatively high barrier height. The device performance cannot satisfy the modern applications that require further reduction on resistance and higher drive currents.

FIG. 2 shows an improved DMOS submitted as a co-pending application by co-inventors of this patent application. The DMOS has an improved configuration. Specifically, in proximity of the gate trench and adjacent to the source, there is a source-body contact trench with an anti-punch through implant disposed along the trench wall. An integrated Schottky diode is formed by depositing a high barrier height metal at the bottom of the source-body contact trench to function as the integrated Schottky contacts. A low barrier height metal is further deposited overlaying the high barrier height metal to provide ohmic contact for source and body. The DMOS device as shown in FIG. 2 provides the advantage of integrating a Schottky in every cell with no loss of die active area to form such a Schottky as in older approach. However, the high barrier height metal as required to achieve acceptable low leakage current in the off state presents a disadvantage due to the higher costs of depositing both the high barrier height metal and the low barrier height metal to meet the requirements of Schottky and source-body ohmic contact.

Additionally, the above device configurations as shown in FIGS. 1A, 1B and 2 are still limited by a breakdown vulnerability at bottom corners of the P+ pocket regions as that shown in FIGS. 1C and 1D. The breakdown vulnerability at the bottom corners at the body type dopant (P+ pocket) regions is due to a small radius of a curvature at the junction near the bottom corners of the P+ pocket regions. Furthermore, there is an abrupt dopant distribution reversal profile as that shown in FIG. 1D. FIG. 1D compares the variation of the doping profile in the JBS P+ pocket region to the doping profile in the MOSFET P body regions along two vertical lines A-A' and B-B' shown on FIG. 1C.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved semiconductor power device integrated with Schottky diode to increase the breakdown voltage of the device. Specifically, an aspect of this invention is to resolve the breakdown vulnerability at the bottom corners of the P+ pocket regions without changing the layout of the MOSFET devices that integrated with the Schottky diode for performance improvements.

Another aspect of this invention is to form the Junction Barrier controlled Schottky (JBS) rectifiers in the Schottky area with improved doping profile to increase the breakdown voltage without affecting the MOSFET cell performance. Furthermore, the JBS rectifiers are implemented with stripe, square closed cells, circular closed cells and hexagonal closed cells configurations.

Another aspect of this invention is to form the JBS rectifiers in the Schottky area with maximized Schottky area by forming the gate fingers as a comb shape with a bottom peripheral gate runner and not running the peripheral gate bus all the way around the die.

Briefly in a preferred embodiment this invention discloses a semiconductor power device that includes an active cell area having a plurality of power transistor cells and a Junction Barrier controlled Schottky (JBS) area. The semiconductor power device includes the JBS area that further includes a plurality of Schottky diodes interspersed between PN junctions disposed on an epitaxial layer near a top surface of a semiconductor substrate wherein the PN junctions further includes a counter dopant region disposed in the epitaxial layer for reducing a sudden reversal of dopant profile near the PN junction for preventing an early breakdown in the PN junction.

Furthermore, this invention discloses a method to form a semiconductor power device with an active cell area that includes a plurality of power transistor cells and a Junction Barrier controlled Schottky (JBS) area that includes a plurality of Schottky diodes. The method further includes a method of implanting body type dopant ions through metal contact opening into an epitaxial layer to form a counter-dopant region surrounding the JBS P+ pockets to reduce a sudden reversal dopant profile near the PN junction to prevent an early breakdown in the Schottky area.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
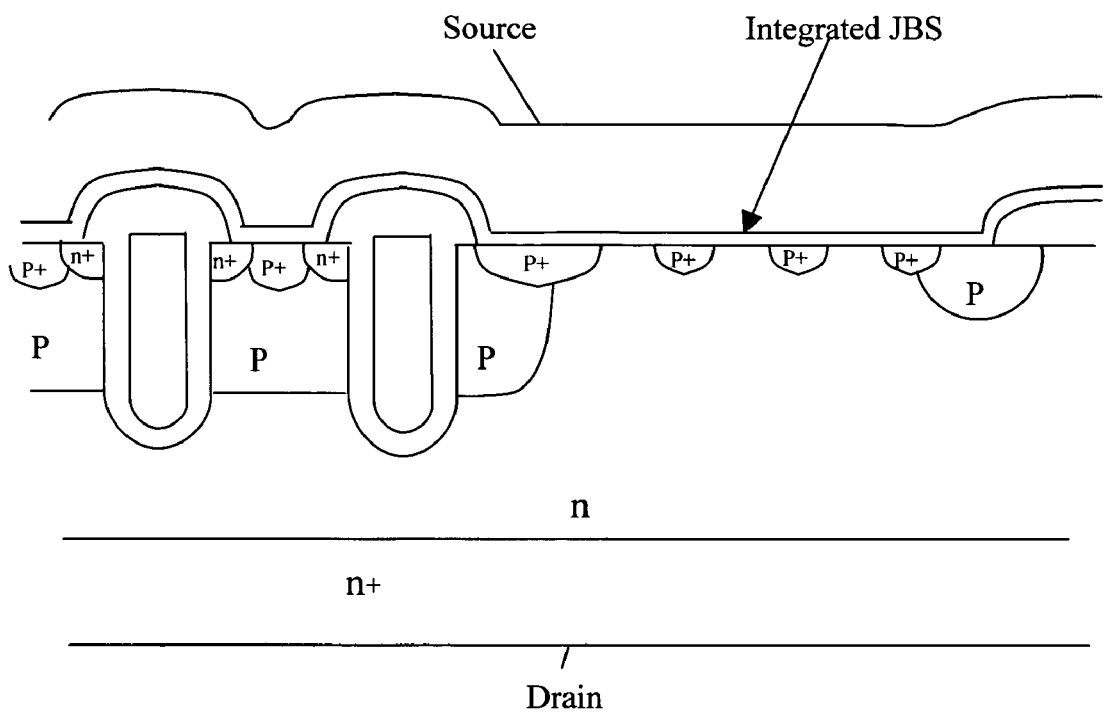
FIG. 1A is a cross sectional view of a conventional trenched MOSFET power device with an integrated Junction Barrier controlled Schottky area.
Figure 1B:
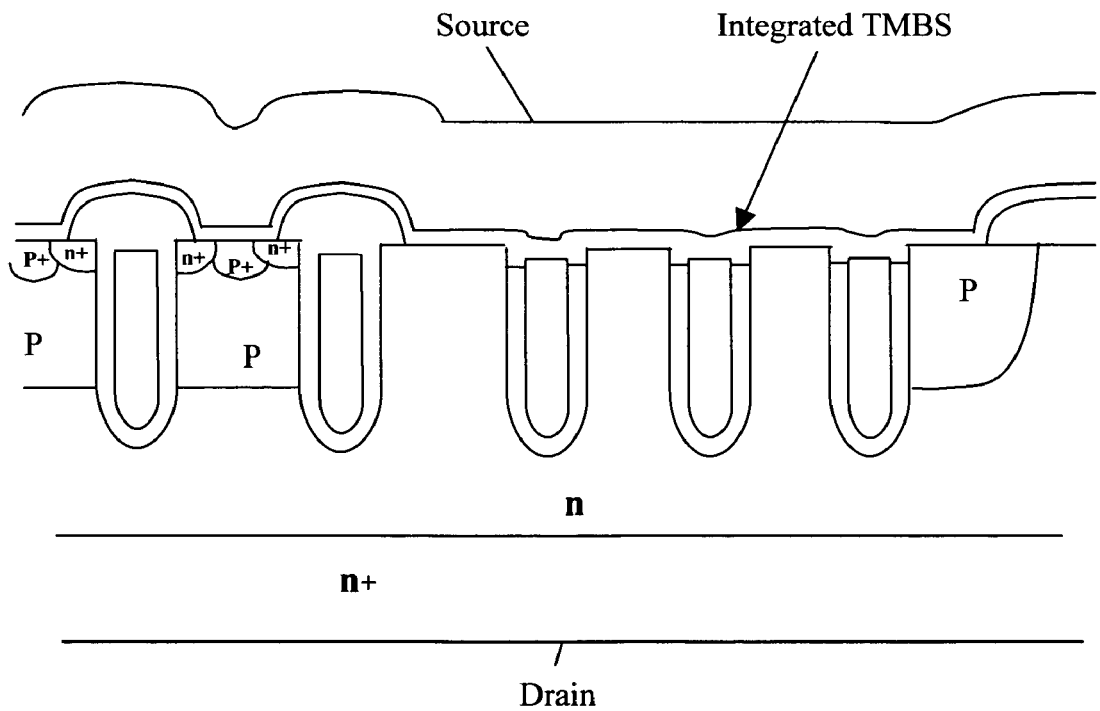
FIG. 1B is a cross sectional view of another conventional trenched MOSFET power device with the integrated Trench MOS Barrier controlled Schottky (TMBS).
Figure 1C:
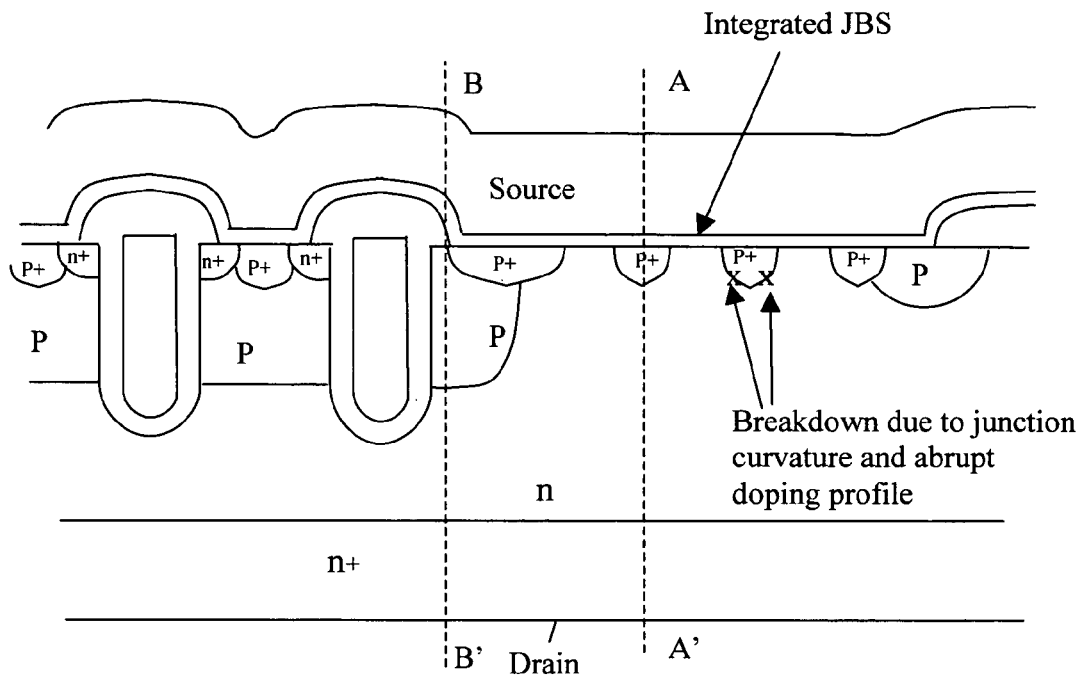
FIG. 1C is a cross sectional view of a conventional trenched MOSFET power device with an integrated JBS area with the breakdown vulnerable points at the bottom corners of the body-type dopant (P+ pocket) regions.
Figure 1D:
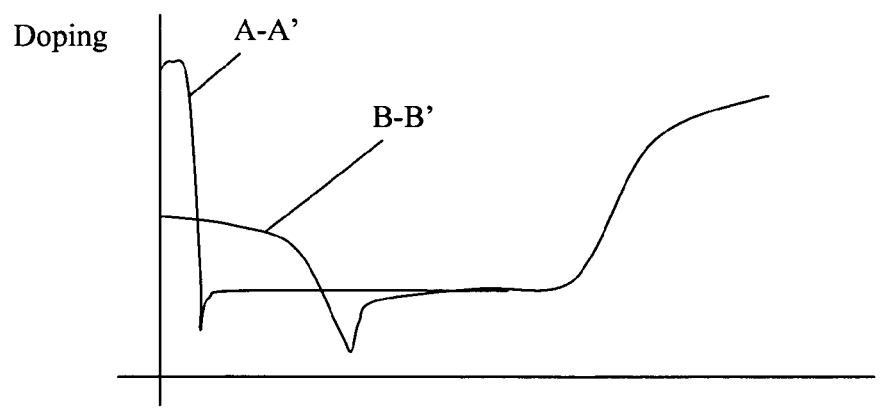
FIG. 1D is a dopant concentration diagram along a vertical direction in the P+ pocket region and the MOSFET body regions of FIGS. 1A and 1B for illustrating the reasons of breakdown vulnerability.
Figure 2:
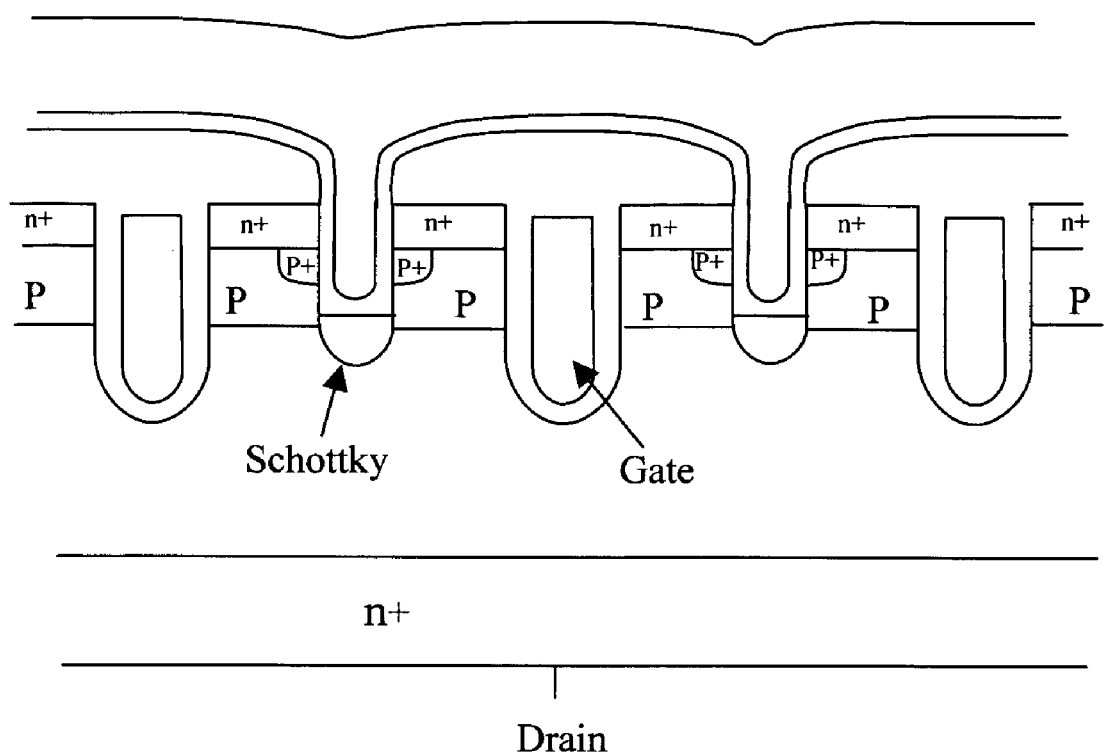
FIG. 2 shows is a cross sectional view of an improved DMOS of a co-pending application by co-inventors of this patent application.
Figure 3A:
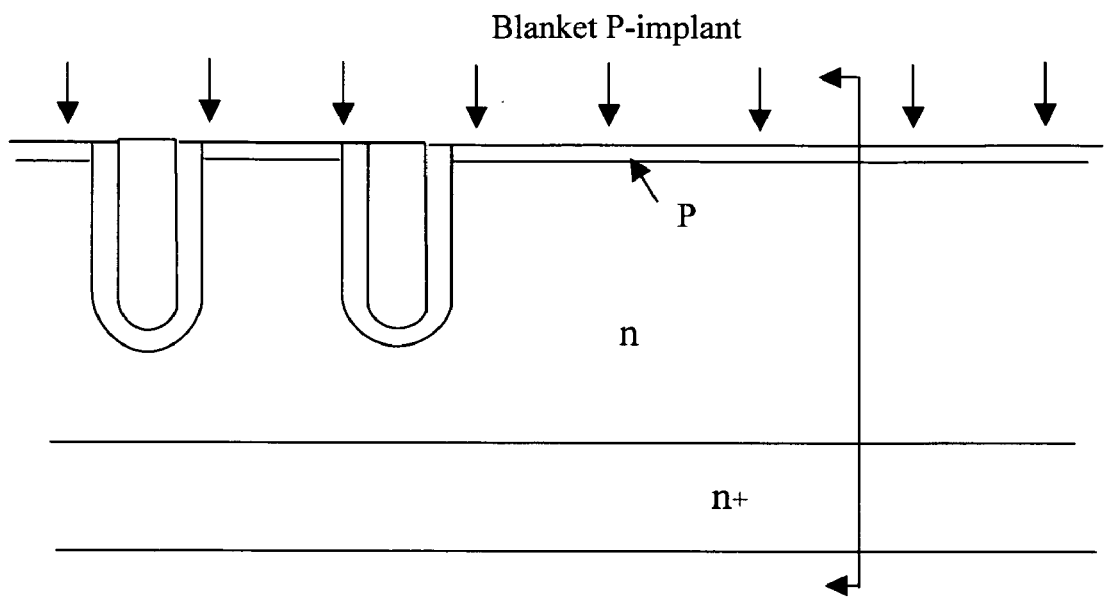
FIGS. 3A and 3B are side cross sectional views before and after the diffusion operation of a MOSFET device of this invention.
Figure 3B:
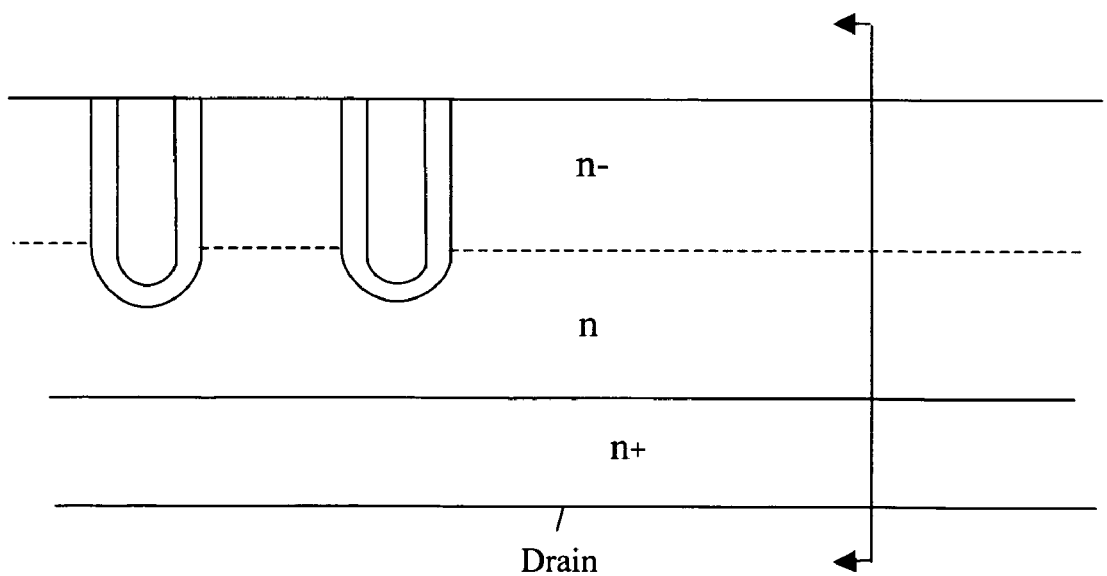
Figure 3C:
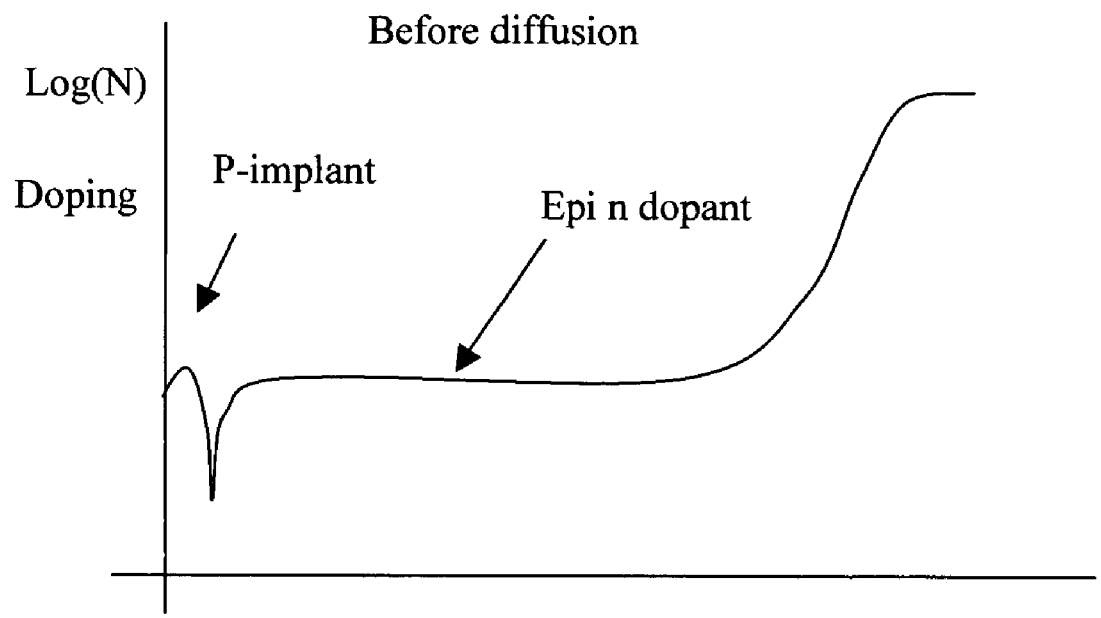
FIGS. 3C and 3D are dopant profile diagrams before and after a light body-type dopant diffusion process of a MOSFET device of this invention.
Figure 3D:
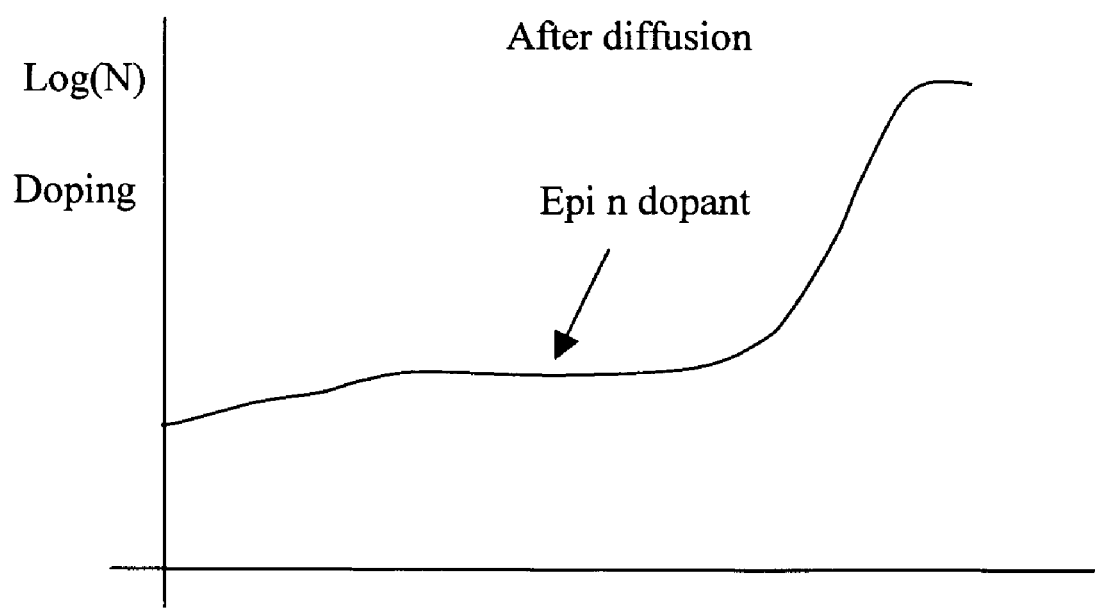
Figure 3E:
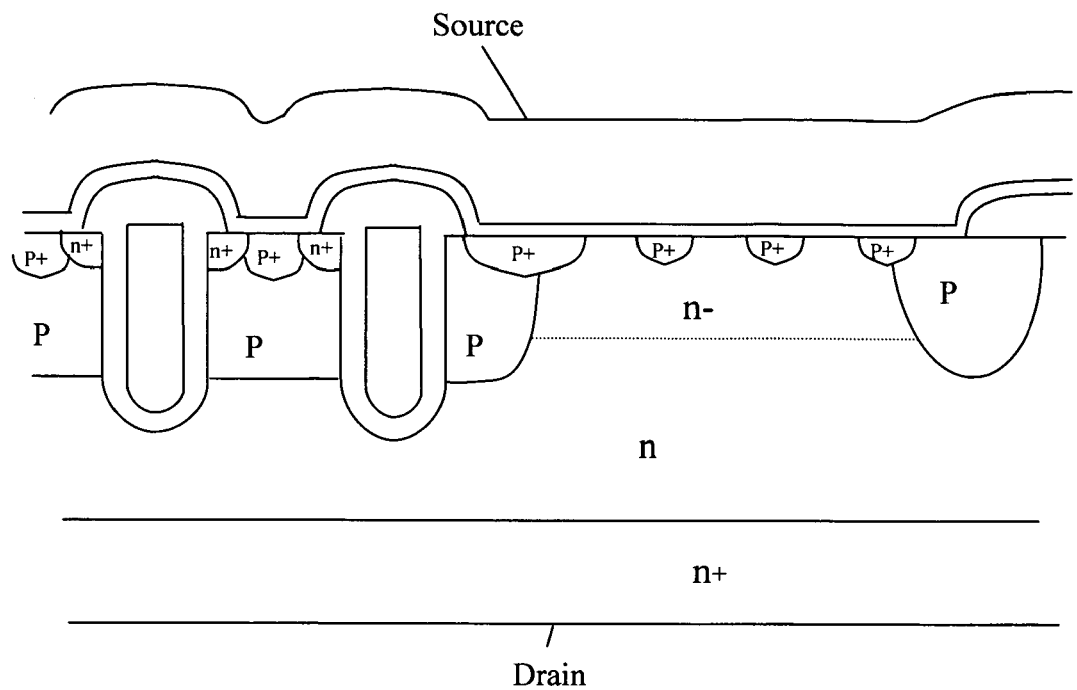
FIG. 3E is a side cross sectional view of the MOSFET device of this invention with improved breakdown voltage in the Schottky regions with the MOS mesa area unaffected.

Referring to FIGS. 3A and 3B for the side cross sectional views of the JBS area to provide the rectification function for a MOSFET device. FIG. 3A shows a blank implant of a low dose of body type dopant ions. For N channel MOSFET device, Boron ions with dosage $5\times10^{11}$ to $5\times10^{12}/cm^2$ may be implanted into the epitaxial layer with energy from 40-500 Kev, preferably with 80-300 Kev. The blank implant of the body type dopant ions is to compensate and lower the doping concentration of a portion of the epitaxial layer to increase epitaxial layer breakdown voltage. In FIG. 3B, the body dopant is then diffused by applying an elevated diffusion temperature ranging from 1000 to 1150 degrees for 1 to 3 hours to diffusion the body type dopant into a depth shallower than the depth of MOSFET body region form in a later step. The implanting body type dopant ions compensate a portion of epi dopant and generate an N− region in the epitaxial layer. This would not significantly affect the MOSFET breakdown or other performance parameter because the P− implant does not exceed the dopant concentration and boundary of MOSFET P body region, which has a higher body type ion concentration. The body type dopant implant can also be carried out after clearing the Schottky area, namely after the oxide etch for Schottky formation. In that case, it is preferred to do multiple energies to create a wider flat counter-doped n− region at the surface as there is less thermal steps in this late device manufacture stage to further spread out the P− doping region. FIG. 3C shows the dopant profile along a vertical line C-C' before the diffusion and FIG. 3D shows the dopant profile after the body type dopant diffusion process. After the diffusion, the N− region has a lower and smooth variation of dopant along the vertical direction in regions for forming Schottky junction barrier. The lower epi dopant concentration in N− region improves breakdown voltage in N− region. FIG. 3E is a cross sectional view of a MOSFET with the Schottky junction areas formed follow the processes shown in FIGS. 3A and 3B. The Schottky junction barriers are surrounded with a lightly doped N− dopant region and the upper portion of the epitaxial layer is now formed with an N− region. The breakdown in this region is increased due to lower carrier concentration. Furthermore the lower concentration in N− region helps to reduce the electrical field across the P+/N− junction although the dopant profile across the P+ Schottky pocket region may be still abrupt. The overall breakdown in Schottky area is thus increased. The light dose body type dopant implant would not affect the MOSFET active cell area because the dopant profiles in the mesa areas are not affected. The counter dopant region disposed in the JBS area having an epitaxial dopant concentration reduction ranging from 20 to 80 percent whereby performance parameters of the power transistor cell in the active cell area are not affected.

Figure 4A:
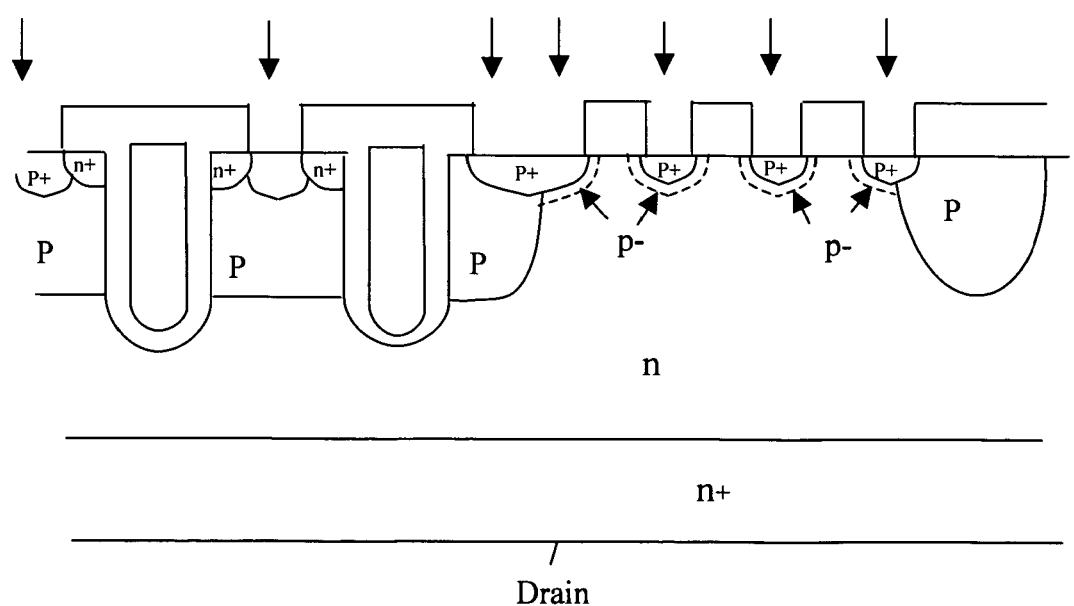
FIG. 4A is a cross sectional view of an alternate MOSFET of this invention with improved breakdown voltage and FIG. 4B is a dopant profile diagram of FIG. 4A.
Figure 4B:
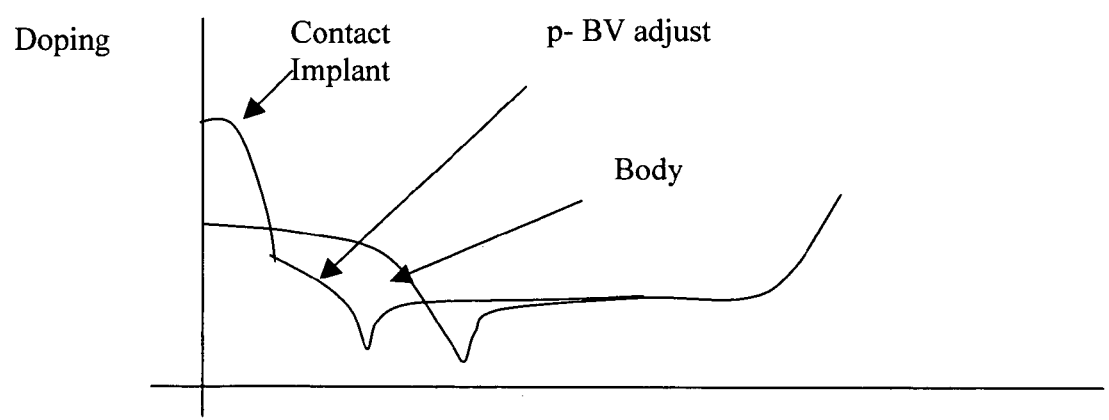

FIG. 4A is a cross sectional view of another preferred embodiment of this invention. An implantation of low dose high-energy P-type dopant ions at an energy level of about 240 to 360 kev is carried out at the time when a contact implant is carried out through the contact openings. The dose is light enough, e.g., 0.1 to $2\times10^{12}/cm^2$ of boron ions, to overcome the epitaxial doping and to create a P−/N− junction as shown in FIG. 4A. These P− regions surrounding the P+ Schottky pocket regions near the top surface of the epitaxial layer is sufficient to elevate the breakdown voltage in the JBS regions. In the meantime, the dose of the high-energy body dopant implant is sufficiently light, i.e., about one-tenth of a typical body implant dosage, so that the performance of the MOSFET device, other than the Schottky BV, such as the threshold voltage, is maintained the same without being affected. FIG. 4B is a doping profile of the MOSFET device along a vertical direction in the body type dopant region after the BV voltage adjustment implant compare to the MOSFET body region doping profile. As shown in FIG. 4B, the slope of P dopant concentration in Schottky P+ pocket region has been greatly changed from abrupt reversal to a gradual variation. This greatly reduces the electric field across the P–N junction in the Schottky pocket region. Furthermore, it greatly reduces the fringing electric field. As a result the premature breakdown due to abrupt dopant distribution and sharp corner are eliminated.

Figure 5A:
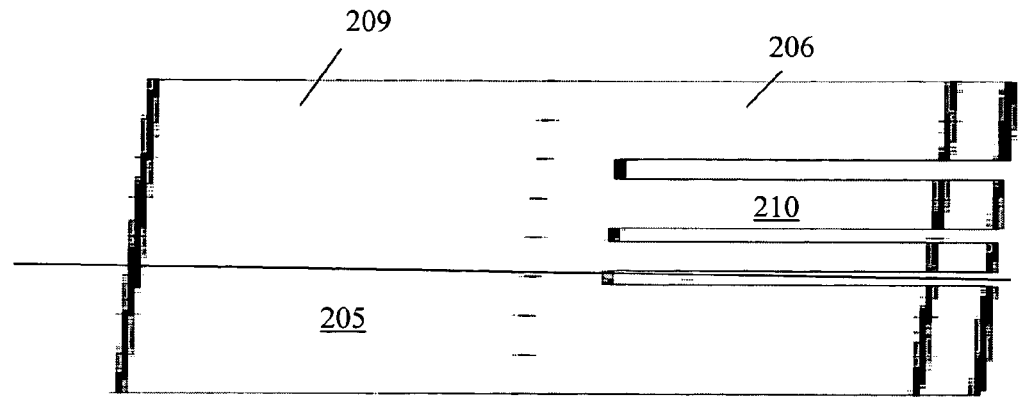
FIGS. 5A to 5K are a serial cross sectional views for describing the manufacturing processes to provide a trenched MOSFET device as shown in FIG. 4A.
Figure 5B:
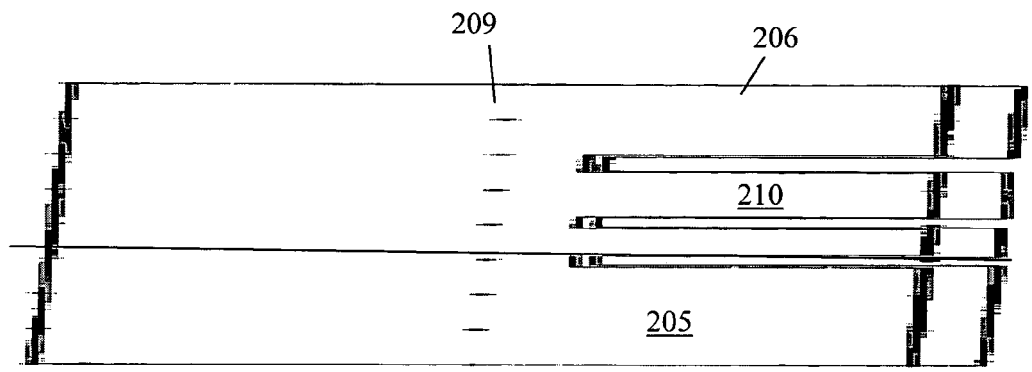
Figure 5C:
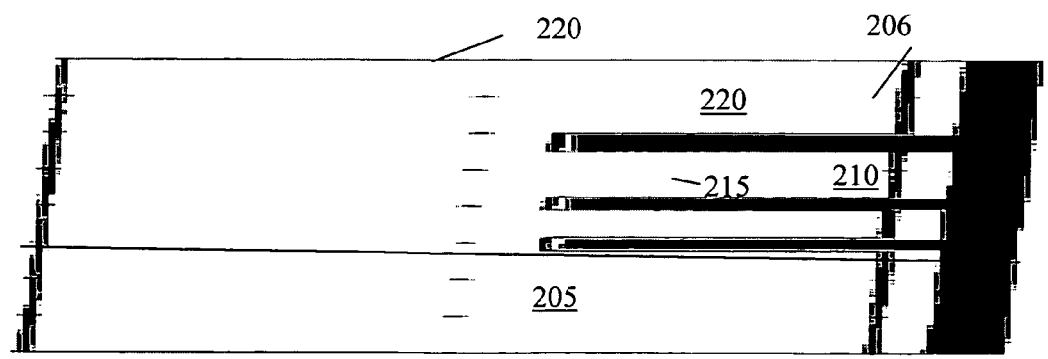

Referring to FIGS. 5A to 5K for a series of cross sectional views to illustrate the processing steps for manufacturing a MOSFET device as shown in FIG. 4A. In FIG. 5A, a trench mask (not shown) is applied as first mask to create an oxide hard mask 206 and then removed. Referring to FIG. 5B, a trench etch process is carried out to open a plurality of trenches 209 in an epitaxial layer 210 supported on a substrate 205. In FIG. 5C, a sacrificial oxidation is performed followed by an oxide etch to remove the damaged surface on the trench wall to smooth the sidewalls. Then a gate oxidation is performed to grow a gate oxide layer 215. An oxide layer 215 is grown followed by depositing a polysilicon layer 220 into the trenches.

Figure 5D:
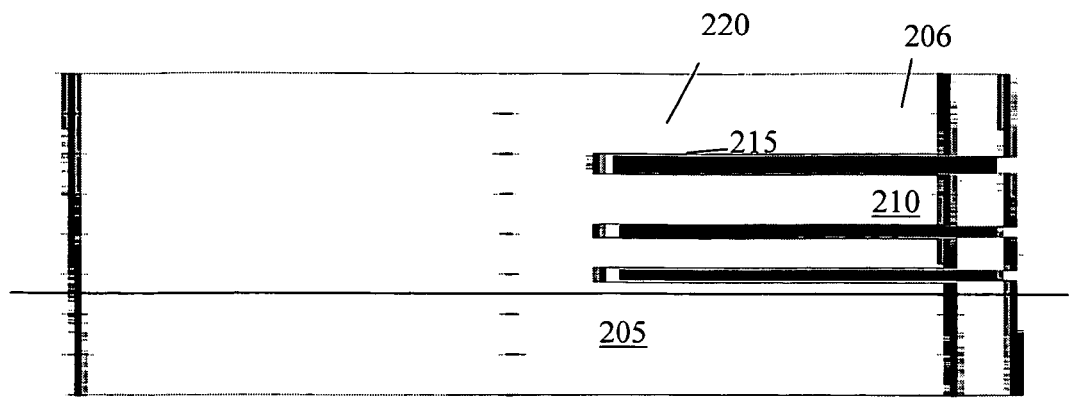
Figure 5E:
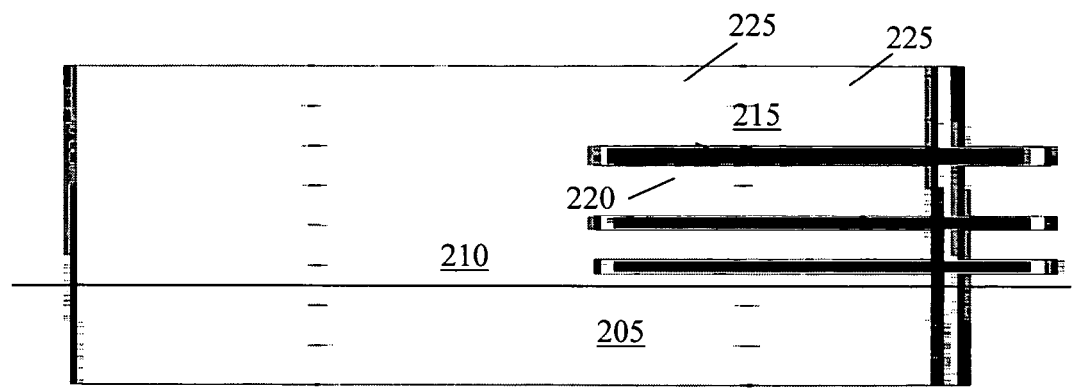
Figure 5F:
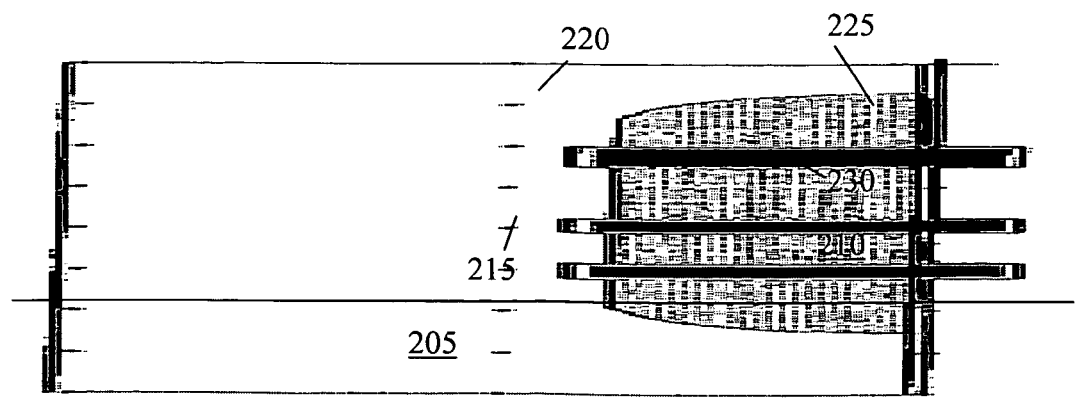
Figure 5G:
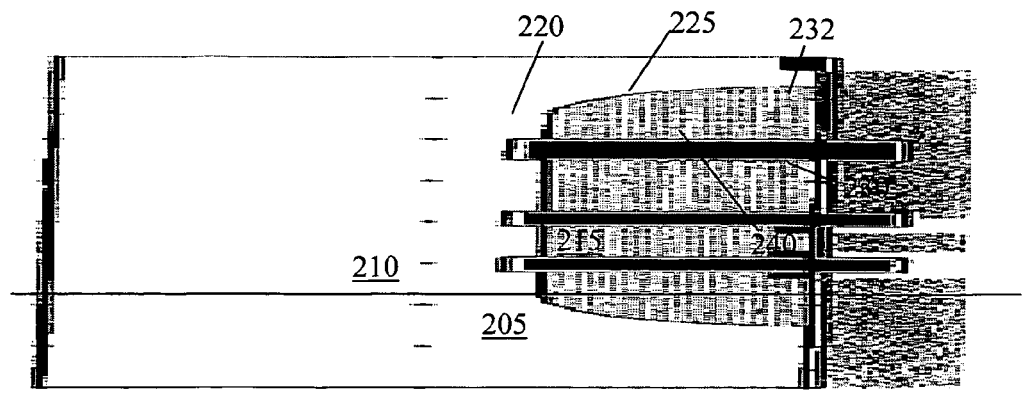
Figure 5H:
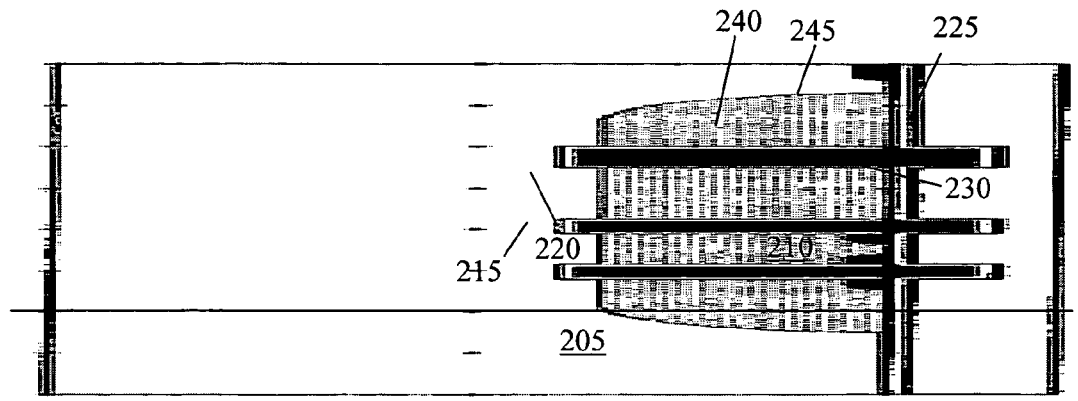
Figure 5I:
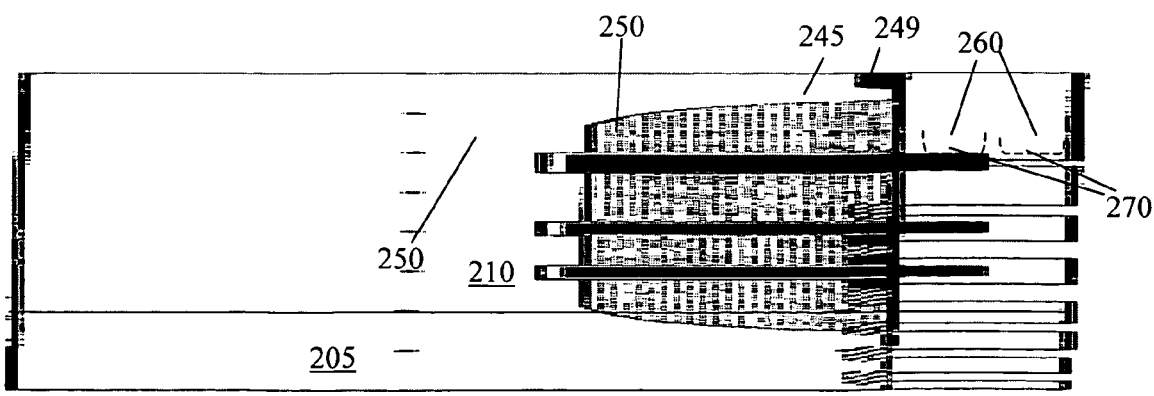

In FIG. 5D, a blanket polysilicon etch back is performed to etch back the polysilicon layer 220. The polysilicon layer 220 is etched back without a mask until it is just below the top surface of the oxide hard-mask 206. In FIG. 5E, the hardmask 206 is etched off followed an oxide re-growth to form an oxide layer 225 on the top surface. In FIG. 5F, a body mask (not shown) is applied to implant the body dopant into the body regions followed by a diffusion process to diffuse the body regions 230 into the epitaxial layer 210. In FIG. 5G, a source mask 232 is applied for source dopant implant to form the source regions 240. In FIG. 5H, the source mask 232 is removed followed by a source drive to diffuse the source regions 240 encompassed in the body regions 230 into the epitaxial layer 210. Then an LTO/BPSG insulation layer 245 is formed on top of the MOSFET device. In FIG. 5I a contact mask (not shown) is applied to open a plurality of contact openings 249. Then a heavy body type dopant implant with does about $1-3\times10^{13}/cm^2$ is carried out to form the contact-enhanced body dopant regions 250 and a plurality of junction barrier Schottky P+ pocket regions 260 in the Schottky areas. Then an implantation of low dose high-energy P-type dopant ions at an energy level of about 240 to 360 kev is carried out through the contact openings 249 to form a light body doped regions 270 surrounding the P+ pocket regions 260 as that shown in FIG. 4A. The dose is light enough, e.g., 0.1 to $2\times10^{12}/cm^2$ of boron ions, to overcome the epitaxial doping to create a P−/N− junction.

Figure 5J:
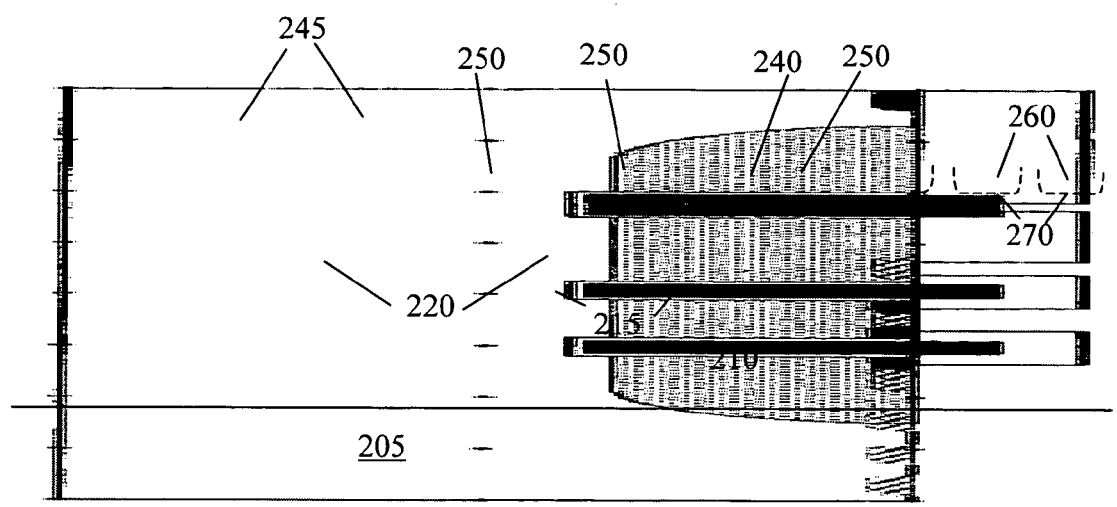
Figure 5K:
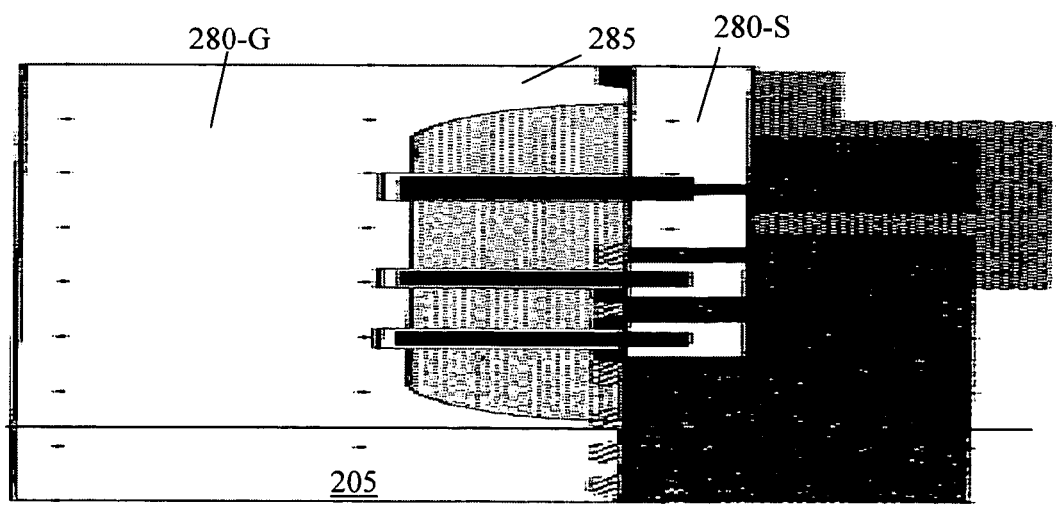

In FIG. 5J, an Schottky activation mask is applied to remove part of the insulation layer 245 from the Schottky areas. In FIG. 5K, a metal layer 280 is formed on the top surface and a metal mask (not shown) is applied to pattern the metal layer into a source metal 280-S and a gate metal 280-G followed by forming and patterning a passivation layer 285 to complete the manufacturing processes of the MOSFET device.

The JBS may be formed in one area or in a plurality of areas on the MOSFET die. It could also be formed in a macro cell structure where each macro cell comprises a plurality of MOSFET cells and a JBS area as in FIG. 8. Each JBS area may further form a plurality of JBS diodes in different layout.

Figure 6A:
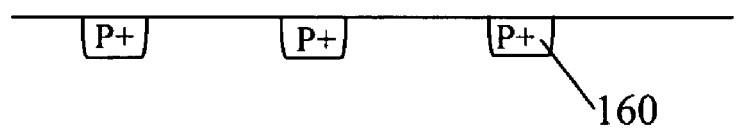
FIG. 6A is a side cross sectional view of junction barrier Schottky (JBS) rectifier and FIGS. 6B to 6D are top views showing the JBS rectifiers are implemented with stripe, square closed cells, circular closed cells and hexagonal closed cells configurations.
Figure 6B:
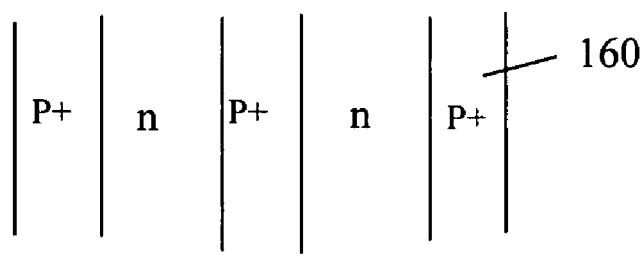
Figure 6C:
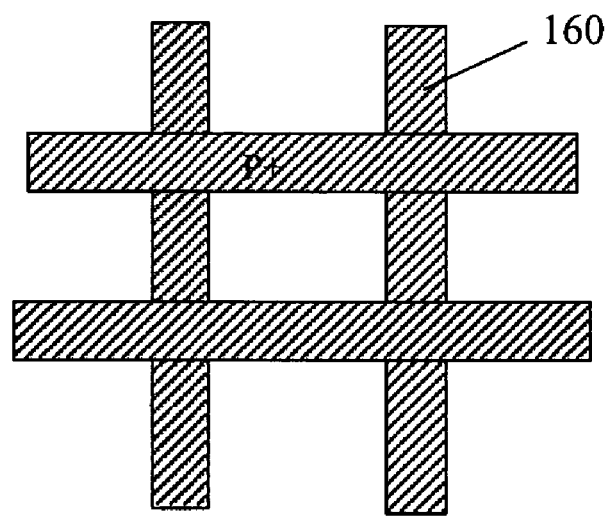
Figure 6D:
Figure 6E:
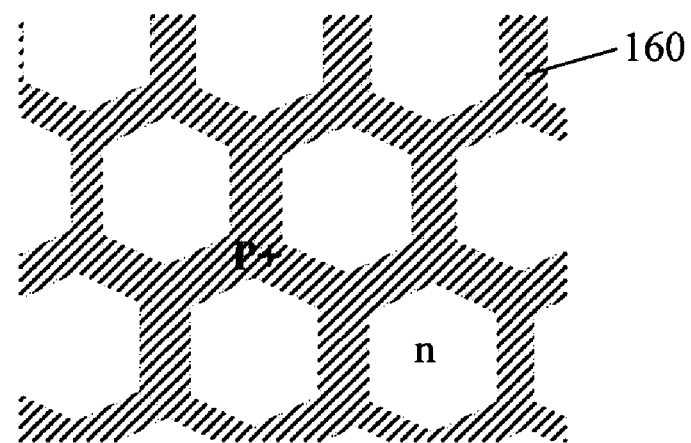

FIG. 6A is a side cross sectional view and FIGS. 6B to 6E are top views of the layout of the JBS P+ pocket regions 160 for this invention. The Schottky barrier junction regions interspersed by P+ pocket regions are implemented with different shapes in the MOSFET device. FIGS. 6B to 6D show that the Schottky junction barrier regions are formed with stripe, square closed cells, circular closed cells and hexagonal closed cells configurations respectfully.

Figure 7:
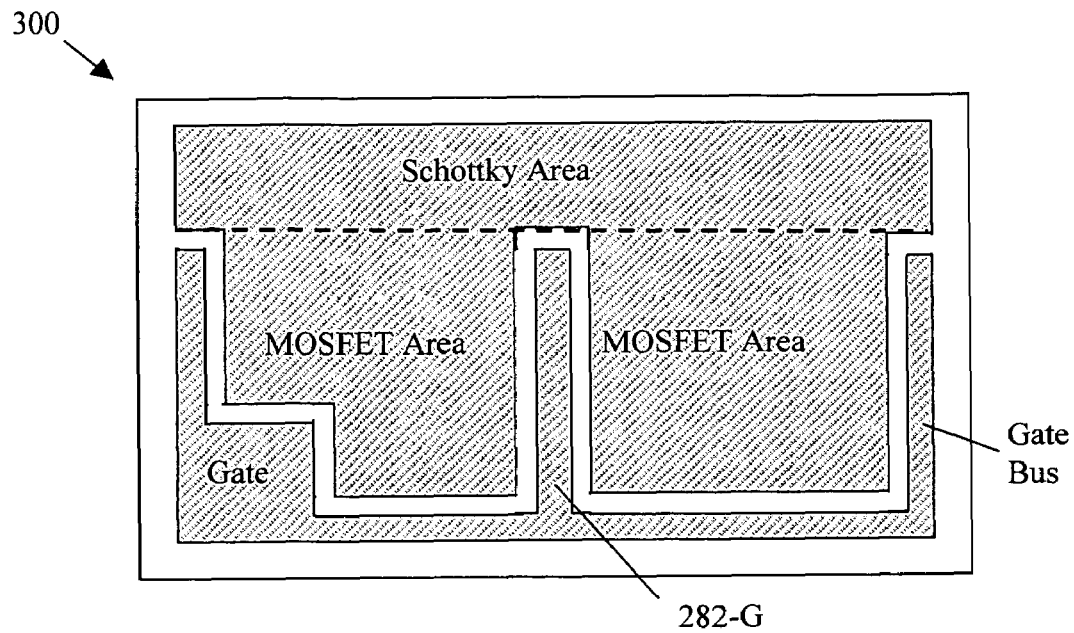
FIG. 7 is a top view of a MOSFET device where the Schottky area is maximized by not running the peripheral gate bus all the way around the die with the gage fingers formed as a comb shape with a bottom peripheral gate runner.
Figure 8:
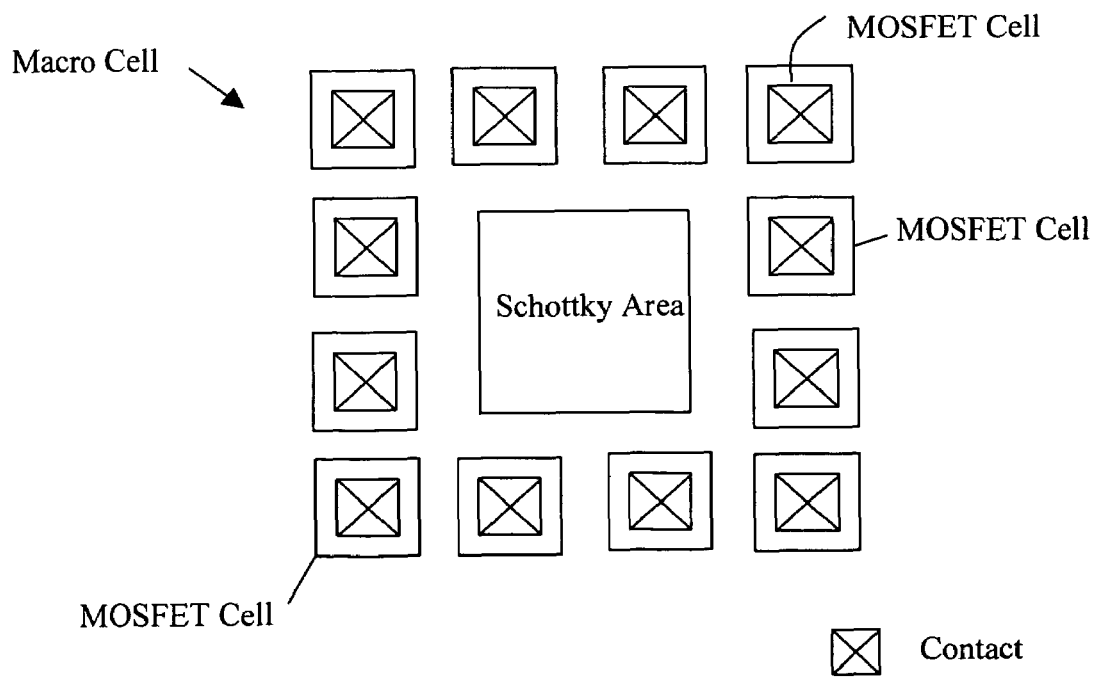
FIG. 8 is a top view of a MOSFET device where the Schottky area is formed within a macro cell structure.

FIG. 7 is a top view of a MOSFET device 300 where the Schottky area is maximized by not running the peripheral gate bus all the way around the die with the gate fingers 282-G formed as a comb shape with a bottom peripheral gate runner. Referring to FIG. 8 for a top view of a MOSFET device where the Schottky area is formed within a macro cell structure.

According to the above descriptions, this invention discloses a semiconductor power device that includes an active cell area having a plurality of power transistor cells and a Junction Barrier controlled Schottky (JBS) area. The JBS area further includes a plurality of Schottky diodes interspersed between PN junctions disposed on an epitaxial layer near a top surface of a semiconductor substrate wherein the JBS further includes a counter dopant region disposed in the epitaxial layer for reducing a sudden reversal of dopant profile near the PN junction for preventing an early breakdown in the PN junction. In another preferred embodiment, the JBS includes body-type-dopant regions disposed in a epitaxial layer wherein the counter dopant region comprises a reduced epi dopant region surrounding the body type dopant region for reducing the sudden reversal of dopant profile near the PN junction. In another preferred embodiment, the JBS includes P-type-dopant regions disposed in a N-type dopant epitaxial layer wherein the counter dopant region comprises a reduced N-type dopant region surrounding the P-type dopant region for reducing the sudden reversal of dopant profile near the PN junction. In another preferred embodiment, the semiconductor power device further includes a metal oxide semiconductor field effect transistor (MOSFET) device. In another preferred embodiment, the semiconductor power device further includes a trenched metal oxide semiconductor field effect transistor (MOSFET) device wherein the active cell area includes a plurality of MOSFET cells. In another preferred embodiment, the JBS area further includes a plurality of Schottky diodes interspersed between PN junctions and the counter dopant regions formed around the Schottky diodes. In another preferred embodiment, the JBS area further includes a plurality of Schottky diodes with body type dopant regions formed in a epitaxial layer with the counter dopant regions formed as reduced dopant regions surrounding the body type dopant regions. In another preferred embodiment, the epitaxial layer further includes an upper epitaxial layer having a reduced source dopant concentration near a top surface encompassing the Schottky diodes above an epitaxial layer having a regular dopant concentration. In another preferred embodiment, the counter dopant region disposed in the JBS area having an epitaxial dopant concentration reduction ranging from 20 to 80 percent whereby performance parameters of the power transistor cell in the active cell area are not affected. In another preferred embodiment, the epitaxial layer further includes an upper epitaxial layer having a reduced dopant concentration near a top surface encompassing the Schottky diodes formed by applying a blank body-type-dopant implant into an epitaxial layer having a regular dopant concentration. In another preferred embodiment, the Schottky diodes includes body-type-dopant regions disposed in an epitaxial layer wherein the counter dopant region comprises a reduced epi dopant region formed by applying a body-type-dopant implant through contact openings to form the counter-dopant regions surrounding the body-type-dopant region for reducing the sudden reversal of dopant profile near the PN junction. In another preferred embodiment, the Schottky diodes configured as open stripes of body-type-dopant regions in the JBS area. In another preferred embodiment, the Schottky diodes configured as intersected stripes of body-type-dopant region surrounding square shaped Schottky contact regions in the JBS area. In another preferred embodiment, the Schottky diodes configured as peripheral stripes of body-type-dopant region surrounding hexagonal shaped Schottky contact regions in the JBS area. In another preferred embodiment, the Schottky diodes configured as peripheral stripes of body-type-dopant region surrounding polygon shaped Schottky contact regions in the JBS area. In another preferred embodiment, the Schottky diodes configured as peripheral areas of body-type-dopant region surrounding circular shaped Schottky contact regions in the JBS area. In another preferred embodiment, the semiconductor power device further includes gate buses formed extended from the active cell area to the JBS area as open combs whereby greater area of the JBS area is provided by not running the gate buses through a peripheral region around the JBS area. In another preferred embodiment, the semiconductor power device further includes a macro cell structure where each macro cell comprises a plurality of MOSFET cells and a JBS area.

According to above descriptions and drawings, this invention further discloses a method for manufacturing a semiconductor power device with an active cell area having a plurality of power transistor cells and a Junction Barrier controlled Schottky (JBS) area. The method further includes a step of forming a plurality of Schottky diodes interspersed between a plurality of PN junctions on an epitaxial layer near a top surface of a semiconductor substrate said JBS area. The method further includes a step of forming a counter dopant region in said epitaxial layer near each of said PN junctions for reducing a sudden reversal of dopant profile near said PN junctions for preventing an early breakdown in said PN junction. In a preferred embodiment, the step of forming the counter dopant region in the epitaxial layer further includes a step of forming an upper epitaxial layer having a reduced dopant concentration near a top surface encompassing the Schottky diodes above an epitaxial layer having a regular dopant concentration. In another preferred embodiment, the step of forming the counter dopant region in the JBS area further includes a step of forming in the JBS area an epitaxial dopant-concentration reduction regions having an epitaxial dopant concentration ranging from twenty to eighty percents of a regular epitaxial dopant concentration whereby performance parameters of the power transistor cell in the active cell area are not affected. In another preferred embodiment, the step of forming the counter dopant region in the epitaxial layer further includes a step of applying a blank body-type-dopant implant into an epitaxial layer to form an upper epitaxial layer having a reduced dopant concentration near a top surface encompassing the Schottky diodes. In another preferred embodiment, the step of forming the counter dopant region in the JBS area further includes a step of applying a body-type-dopant implant through contact openings to form the counter-dopant regions surrounding the body-type-dopant regions for reducing the sudden reversal of dopant profile near the PN junction. In another preferred embodiment, the method further includes a step of forming the Schottky diodes as open stripes interspersed between body-type-dopant regions in the JBS area. In another preferred embodiment, the method further includes a step of forming the Schottky diodes as intersected stripes of body-type-dopant region surrounding square shaped Schottky contact regions in the JBS In another preferred embodiment, the method further includes a step of forming the Schottky diodes as peripheral stripes of body-type-dopant region surrounding hexagonal shaped Schottky contact regions in the JBS area. In another preferred embodiment, the method further includes a step of forming the Schottky diodes as peripheral stripes of body-type-dopant region surrounding polygon shaped Schottky contact regions in the JBS area. In another preferred embodiment, the method further includes a step of forming the Schottky diodes as peripheral areas of body-type-dopant region surrounding circular shaped Schottky contact regions in the JBS area. In another preferred embodiment, the method further includes a step of forming gate buses to extend from the active cell area to the JBS area as open combs whereby greater area of the JBS area is provided by not running the gate buses through a peripheral region around the JBS area. In another preferred embodiment, the method further includes a step of forming a macro cell structure where each macro cell comprises a plurality of MOSFET cells and a JBS area.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A semiconductor power device comprising an active cell area having a plurality of power transistor cells and a Junction Barrier controlled Schottky (JBS) area wherein:
    said JBS area comprising a plurality of Schottky diodes interspersed between a plurality of PN junctions disposed on an epitaxial layer near a top surface of a semiconductor substrate wherein said JBS area further includes a counter dopant region disposed in said epitaxial layer for reducing a sudden reversal of dopant profile near said PN junction for preventing an early breakdown in said PN junction.

2. The semiconductor power device of claim 1 wherein:
    said JBS comprising body-type-dopant regions disposed in an epitaxial layer wherein said counter dopant region comprises a reduced epitaxial dopant region.

3. The semiconductor power device of claim 1 wherein:
    said JBS comprising P-type-dopant regions disposed in a N-type-dopant epitaxial layer wherein said counter dopant region comprises a reduced N-type dopant region surrounding said P-type-dopant regions for reducing said sudden reversal of dopant profile near said PN junction.

4. The semiconductor power device of claim 1 wherein:
    said semiconductor power device further comprising a metal oxide semiconductor field effect transistor (MOSFET) device.

5. The semiconductor power device of claim 1 further comprising:
    a macro cell structure wherein each macro cell comprises a plurality of MOSFET cells and a JBS area.

6. The semiconductor power device of claim 1 wherein:
    said epitaxial layer further comprising an upper epitaxial layer having a reduced dopant concentration near a top surface encompassing said Schottky diodes above an epitaxial layer having a regular dopant concentration.

7. The semiconductor power device of claim 1 wherein:
    said counter dopant region disposed in said JBS area having an epitaxial dopant concentration reduction ranging from twenty to eighty percents whereby performance parameters of said power transistor cell in said active cell area are not affected.

8. The semiconductor power device of claim 1 wherein: said epitaxial layer further comprising an upper epitaxial layer having a reduced dopant concentration near a top surface encompassing said body-type-dopant regions formed by applying a blank body-type-dopant implant into an epitaxial layer having a regular dopant concentration.

9. The semiconductor power device of claim 1 wherein: said Schottky diodes interspersed between body-type-dopant regions disposed in an epitaxial layer wherein said counter dopant region comprises a reduced epitaxial dopant region formed by applying a body-type-dopant implant through contact openings to form said counter-dopant regions surrounding said body-type-dopant regions for reducing said sudden reversal of dopant profile near said PN junction.

10. The semiconductor power device of claim 1 wherein: said Schottky diodes configured as open stripes interspersed between body-type-dopant regions in said JBS area.

11. The semiconductor power device of claim 1 wherein: said Schottky diodes configured as intersected stripes of body-type-dopant region surrounding square shaped Schottky contact regions in said JBS area.

12. The semiconductor power device of claim 1 wherein: said Schottky diodes configured as peripheral stripes of body-type-dopant region surrounding hexagonal shaped Schottky contact regions in said JBS area.

13. The semiconductor power device of claim 1 wherein: said Schottky diodes configured as peripheral stripes of body-type-dopant region surrounding polygon shaped Schottky contact regions in said JBS area.

14. The semiconductor power device of claim 1 wherein: said Schottky diodes configured as peripheral areas of body-type-dopant region surrounding circular shaped Schottky contact regions in said JBS area.

15. The semiconductor power device of claim 1 further comprising:
gate buses formed extended from said active cell area to said JBS area as open combs whereby greater area of said JBS area is provided by not running said gate buses through a peripheral region around said JBS area.

16. A method for manufacturing a semiconductor power device with an active cell area having a plurality of power transistor cells and a junction barrier Schottky (JBS) area further comprising a step of:
forming a plurality of Schottky diodes by forming a plurality of PN junctions on an epitaxial layer near a top surface of a semiconductor substrate in said JBS area; and
forming a counter dopant region in said epitaxial layer near each of said PN junctions for reducing a sudden reversal of dopant profile near said PN junctions for preventing an early breakdown in said PN junction.

17. The method of claim 16 wherein: said step of forming said counter dopant region in said epitaxial layer further comprising a step of forming an upper epitaxial layer having a reduced dopant concentration near a top surface encompassing said Schottky diodes above an epitaxial layer having a regular dopant concentration.

18. The method of claim 16 wherein: said step of forming said counter dopant region in said JBS area further comprising a step of forming in said JBS area an epitaxial dopant-concentration reduction regions having an epitaxial dopant concentration ranging from twenty to eighty percents of a regular epitaxial dopant concentration whereby performance parameters of said power transistor cell in said active cell area are not affected.

19. The method of claim 16 wherein: said step of forming said counter dopant region in said epitaxial layer further comprising a step of applying a blank body-type-dopant implant into an epitaxial layer to form an upper epitaxial layer having a reduced dopant concentration near a top surface encompassing said Schottky diodes.

20. The method of claim 16 wherein: said step of forming said counter dopant region in said JBS area further comprising a step of applying a body-type-dopant implant through contact openings to form said counter-dopant regions surrounding said body-type-dopant regions for reducing said sudden reversal of dopant profile near said PN junction.

21. The method of claim 16 further comprising a step of: forming said Schottky diodes as open stripes interspersed between body-type-dopant regions in said JBS area.

22. The method of claim 16 further comprising a step of: forming said Schottky diodes as intersected stripes of body-type-dopant region surrounding square shaped epitaxial dopant regions in said JBS area.

23. The method of claim 16 further comprising a step of: forming said Schottky diodes as peripheral stripes of body-type-dopant region surrounding hexagonal shaped epitaxial dopant regions in said JBS area.

24. The method of claim 16 further comprising a step of: forming said Schottky diodes as peripheral stripes of body-type-dopant region surrounding polygon shaped epitaxial dopant regions in said JBS area.

25. The method of claim 16 further comprising a step of: forming said Schottky diodes as peripheral areas of body-type-dopant region surrounding circular shaped epitaxial dopant regions in said JBS area.

26. The method of claim 16 further comprising a step of: forming gate buses to extend from said active cell area to said JBS area as open combs whereby greater area of said JBS area is provided by not running said gate buses through a peripheral region around said JBS area.

27. A semiconductor power device comprising an active cell area having a plurality of power transistor cells and a Junction Barrier controlled Schottky (JBS) area wherein:
said JBS area comprising a plurality of Schottky diodes each interspersed between a plurality of PN junctions wherein each said PN junction comprising a body-type-dopant region disposed on an epitaxial layer near a top surface of a semiconductor substrate; and
wherein said body-type-dopant regions further comprising a heavy body-type-dopant region and a light body-type-dopant region surrounding said heavy body-type-dopant region for reducing a sudden reversal of dopant profile near said PN junctions for preventing an early breakdown in said PN junction.

28. The semiconductor power device of claim 27 wherein: said body-type-dopant regions comprising a P-type-dopant disposed in a N-type-dopant epitaxial layer.

29. The semiconductor power device of claim 27 wherein: said semiconductor power device further comprising a metal oxide semiconductor field effect transistor (MOSFET) device.

30. The semiconductor power device of claim 27 wherein:
said semiconductor power device further comprising a trenched metal oxide semiconductor field effect transistor (MOSFET) device wherein said active cell area comprising a plurality of MOSFET cells.

31. The semiconductor power device of claim 27 wherein:
said epitaxial layer further comprising an upper epitaxial layer having a reduced dopant concentration near a top surface encompassing said Schottky diodes above an epitaxial layer having a regular dopant concentration.

32. The semiconductor power device of claim 27 wherein:
said counter dopant region disposed in said JBS area having an epitaxial dopant concentration reduction ranging from twenty to eighty percents whereby performance parameters of said power transistor cell in said active cell area are not affected.

33. The semiconductor power device of claim 27 wherein:
said Schottky diodes configured as open stripes interspersed between body-type-dopant regions in said JBS area.

34. The semiconductor power device of claim 27 wherein:
said Schottky diodes configured as intersected stripes of body-type-dopant region surrounding square shaped Schottky contact regions in said JBS area.

35. The semiconductor power device of claim 27 wherein:
said Schottky diodes configured as peripheral stripes of body-type-dopant region surrounding hexagonal shaped Schottky contact regions in said JBS area.

36. The semiconductor power device of claim 27 wherein:
said Schottky diodes configured as peripheral stripes of body-type-dopant region surrounding polygon shaped Schottky contact regions in said JBS area.

37. The semiconductor power device of claim 27 wherein:
said Schottky diodes configured as peripheral areas of body-type-dopant region surrounding circular shaped Schottky contact regions in said JBS area.

38. The semiconductor power device of claim 27 further comprising:
gate buses formed extended from said active cell area to said JBS area as open combs whereby greater area of said JBS area is provided by not running said gate buses through a peripheral region around said JBS area.

39. The semiconductor power device of claim 27 further comprising:
a macro cell structure wherein each macro cell comprises a plurality of MOSFET cells and a JBS area.

* * * * *